(12) United States Patent
Harada et al.

(10) Patent No.: US 10,607,840 B2
(45) Date of Patent: Mar. 31, 2020

(54) SEMICONDUCTOR DEVICE WITH P-TYPE ALXINYGAL-X-YN AND OHMIC ELECTRODE THEREOF

(71) Applicant: PANASONIC INTELLECTUAL PROPERTY MANAGEMENT CO., LTD., Osaka (JP)

(72) Inventors: Takeshi Harada, Toyama (JP); Koji Utaka, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/926,636

(22) Filed: Mar. 20, 2018

(65) Prior Publication Data

US 2018/0218910 A1 Aug. 2, 2018

Related U.S. Application Data

(63) Continuation of application No. PCT/JP2016/004291, filed on Sep. 20, 2016.

(30) Foreign Application Priority Data

Sep. 25, 2015 (JP) .................................. 2015-188307

(51) Int. Cl.
*H01L 29/45* (2006.01)
*H01L 21/28* (2006.01)
(Continued)

(52) U.S. Cl.
CPC ........ *H01L 21/28* (2013.01); *H01L 21/28575* (2013.01); *H01L 27/098* (2013.01);
(Continued)

(58) Field of Classification Search
CPC ......... H01L 29/77064; H01L 29/66431; H01L 29/66462; H01L 29/778–7789;
(Continued)

(56) References Cited

U.S. PATENT DOCUMENTS

2009/0212325 A1 8/2009 Sato
2010/0155701 A1* 6/2010 Radosavljevic .... H01L 29/4236
257/24

(Continued)

FOREIGN PATENT DOCUMENTS

JP 2009-200395 A 9/2009

OTHER PUBLICATIONS

International Search Report and Written Opinion issued in International Patent Application No. PCT/JP2016/004291, dated Nov. 29, 2016; with partial English translation.

*Primary Examiner* — Shaun M Campbell
*Assistant Examiner* — Suberr L Chi
(74) *Attorney, Agent, or Firm* — McDermott Will & Emery LLP

(57) ABSTRACT

A semiconductor device includes: a substrate; a p-type GaN layer that is formed above the substrate, and includes GaN containing p-type impurities; and a Ti film formed on a surface of the p-type GaN layer. The Ti film includes a Ti film containing no nitrogen and a nitrogen-containing Ti film that is less chemically active than such Ti film. The nitrogen-containing Ti film continuously surrounds an outer periphery of the Ti film containing no nitrogen in a planar view.

14 Claims, 9 Drawing Sheets

(51) Int. Cl.
*H01L 29/417* (2006.01)
*H01L 29/423* (2006.01)
*H01L 29/49* (2006.01)
*H01L 29/32* (2006.01)
*H01L 29/06* (2006.01)
*H01L 29/66* (2006.01)
*H01L 29/10* (2006.01)
*H01L 29/778* (2006.01)
*H01L 21/285* (2006.01)
*H01L 27/098* (2006.01)
*H01L 29/808* (2006.01)
*H01L 29/812* (2006.01)
*H01L 29/20* (2006.01)

(52) U.S. Cl.
CPC ...... *H01L 29/0684* (2013.01); *H01L 29/1066* (2013.01); *H01L 29/32* (2013.01); *H01L 29/417* (2013.01); *H01L 29/423* (2013.01); *H01L 29/452* (2013.01); *H01L 29/49* (2013.01); *H01L 29/66462* (2013.01); *H01L 29/778* (2013.01); *H01L 29/7786* (2013.01); *H01L 29/808* (2013.01); *H01L 29/812* (2013.01); *H01L 29/2003* (2013.01)

(58) Field of Classification Search
CPC . H01L 2924/13064; H01L 29/122–127; H01L 29/15–158; H01L 29/435; H01L 29/495–4958; H01L 19/4966–4975; H01L 21/28061; H01L 21/28079–28088; H01L 21/32051–32053; H01L 29/4925–4941; H01L 28/4958; H01L 29/42312–42392; H01L 29/0891; H01L 29/66848; H01L 29/802; H01L 29/812
See application file for complete search history.

(56) References Cited

U.S. PATENT DOCUMENTS

| | | | |
|---|---|---|---|
| 2013/0043485 A1* | 2/2013 | Ueno | H01L 29/42316 257/76 |
| 2014/0117303 A1* | 5/2014 | Wang | H01L 45/145 257/4 |
| 2014/0167062 A1* | 6/2014 | Oka | H01L 29/2003 257/76 |
| 2014/0264367 A1* | 9/2014 | Banerjee | H01L 29/66431 257/76 |

* cited by examiner

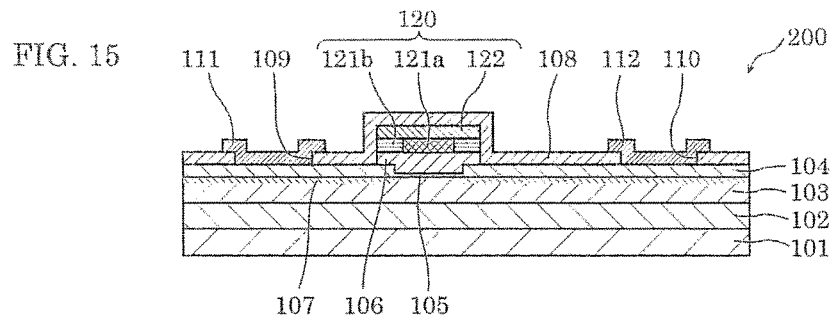
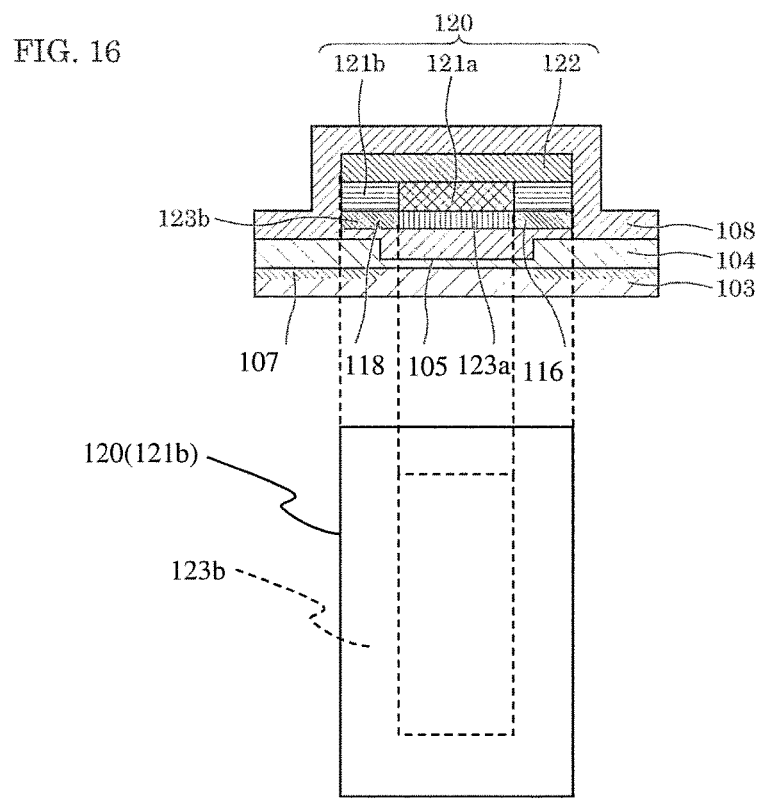
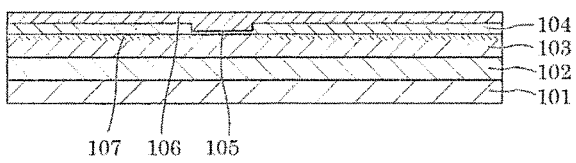
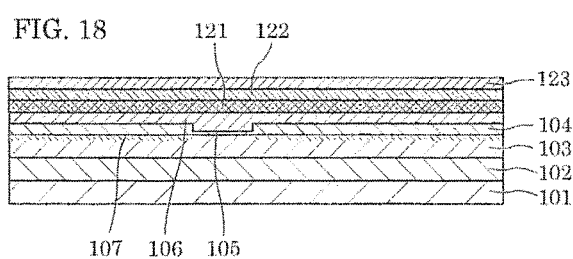

SEMICONDUCTOR DEVICE WITH P-TYPE ALXINYGAL-X-YN AND OHMIC ELECTRODE THEREOF

CROSS REFERENCE TO RELATED APPLICATIONS

This application is a U.S. continuation application of PCT International Patent Application Number PCT/JP2016/004291 filed on Sep. 20, 2016, claiming the benefit of priority of Japanese Patent Application Number 2015-188307 filed on Sep. 25, 2015, the entire contents of which are hereby incorporated by reference.

BACKGROUND

1. Technical Field

The present disclosure relates to a semiconductor device and a method of manufacturing the same.

2. Description of the Related Art

Power switching semiconductor devices are required to have low on-state resistance to reduce power loss. From the safety point of view, the power switching semiconductor devices are strongly demanded to further possess normally-off characteristics to interrupt the current in a zero-bias condition.

Japanese Unexamined Patent Application Publication No. 2009-200395 discloses, for example, a technology to enable a GaN-based semiconductor device to have low on-state resistance and normally-off characteristics. Such semiconductor device uses, as a gate, a p-type GaN layer, below which a gate recess is further formed. The structure disclosed in Japanese Unexamined Patent Application Publication No. 2009-200395 enables a two-dimensional electron gas to disappear in a channel below the gate, and thus achieves a low on-state resistance semiconductor device with normally-off characteristics.

The p-type GaN layer is electrically highly resistive. To achieve fast switching characteristics, it is thus essential to stack the p-type GaN layer and the gate electrode on each other so that the entire gate has a low resistance. In so doing, not only the gate electrode itself, but also a contact between the p-type GaN layer and the gate electrode is required to have a low resistance.

Methods of forming a contact to a p-type GaN layer include a method that forms a gate electrode made of Ti on a surface of the p-type GaN layer. The formation of the gate electrode made of Ti enables hydrogen contained in the p-type GaN layer to be absorbed by Ti, resulting in a higher acceptor ion concentration in the vicinity of the interface. This method thus provides a semiconductor device having a low-resistance contact between the p-type GaN layer and the gate electrode.

The above-described technology, however, has a problem in that the amount of gate leakage current increases in the semiconductor device.

The present disclosure has been conceived in view of the above-described problem, and its object is to provide a semiconductor device and a method of manufacturing the same that are capable of reducing the amount of gate leakage current, while achieving normally-off characteristics and fast switching characteristics.

SUMMARY

To solve the above-described problem, the semiconductor device according to one aspect of the present disclosure is a semiconductor device including: a substrate; a p-type semiconductor layer that is formed above the substrate, and includes $Al_xIn_yGa_{1-x-y}N$ containing p-type impurities, where $0 \leq x \leq 1$, $0 \leq y < 1$; and an ohmic electrode that is in contact with a top surface of the p-type semiconductor layer. The ohmic electrode includes a first metal that is highly chemically active, and a second metal that is less chemically active than the first metal. The second metal continuously surrounds an outer periphery of the first metal in a planar view.

This structure enables the formation of a high-resistance junction (substantial ohmic junction or Schottky junction with a high contact resistivity) immediately above the outer end of the gate recess. Stated differently, the above structure allows for the formation of two types of contacts with different levels of resistivity to the p-type semiconductor layer. Accordingly, even if the semiconductor device includes any defects, it is possible to keep low a voltage applied to the defect due to a voltage drop at the interface between the p-type semiconductor layer and the ohmic electrode. As such, the present disclosure is capable of keeping low the amount of gate leakage current in the semiconductor device.

Moreover, since the second metal is chemically inactive and has a dense structure that inhibits the passage of other substances, the quality of the first metal located inside the second metal is subjected to little change. As such, the present disclosure is capable of providing a semiconductor device having a strong tolerance to harsh conditions (e.g., high temperature and high humidity) for a long period of time. The present disclosure is also capable of providing a current path in the semiconductor device.

Also, a standard Gibbs energy of formation of the first metal may be greater than a standard Gibbs energy of formation of the second metal.

Also, a hydrogen absorption capacity of the first metal may be higher than a hydrogen absorption capacity of the second metal.

Also, the p-type semiconductor layer may include: a first activation region that is in contact with the first metal; and a second activation region that is in contact with the second metal. An acceptor ion concentration of the first activation region may be higher than an acceptor ion concentration of the second activation region.

This structure enables hydrogen contained in the p-type semiconductor layer to be absorbed by the first metal, thereby forming the first activation region with a higher acceptor ion concertation, at the interface between the p-type semiconductor layer and the first metal, than that of the surrounding regions. Stated differently, this structure enables the formation of a high-resistance junction immediately above the outer end of the gate recess. Accordingly, since the width of a depletion layer in the first activation region is extremely small, the interface between the p-type semiconductor layer and the first metal exhibits ohmic characteristics.

Also, a first semiconductor layer having a surface with a stepped portion may be formed above the substrate, the p-type semiconductor layer may be formed on the stepped portion, and the second activation region may be formed immediately above an outer end of the stepped portion.

This structure allows no two-dimensional electron gas to occur in a region below the stepped portion, and thus provides a semiconductor device having normally-off characteristics. This structure also allows for the control of threshold voltage and for the reduction in the amount of gate leakage current in the semiconductor device.

Also, a contact resistivity between the first metal and the p-type semiconductor layer may be lower than a contact resistivity between the second metal and the p-type semiconductor layer.

This structure allows for the formation of two types of contacts with different levels of resistance. Accordingly, even if the semiconductor device includes any defects, it is possible to keep low a voltage applied to the defect due to a voltage drop at the interface between the p-type semiconductor layer and the first metal. As such, the present disclosure is capable of keeping low the amount of gate leakage current.

Also, the second metal may be in Schottky junction with the p-type semiconductor layer.

This structure achieves fast switching of the semiconductor device.

Also, the p-type semiconductor layer and the ohmic electrode may be processed into an identical shape in a planar view.

This structure reduces the interelectrode capacitance between the p-type semiconductor layer and the ohmic electrode.

Also, the first metal may include Ti, and the second metal may include TiN.

Also, the first metal may include one of Ti, Pd, and Ni, and the second metal may include one of hydrogen-containing Ti, hydrogen-containing Pd, and hydrogen-containing Ni.

This structure enables hydrogen contained in the p-type semiconductor layer to be absorbed, thereby forming the first activation region with a higher acceptor ion concertation than that of the surrounding regions.

Also, a concentration of hydrogen or nitrogen contained in the second metal may continuously decrease from an end face toward inside of the second metal.

Also, a third metal may be formed on a top surface of the first metal, and the second metal or the third metal may cover the top surface and a side surface of the first metal without any exposed portions.

This structure allows for the reduction of the gate resistance in the semiconductor device. This structure also protects the ohmic electrode from possible damages in, for example, the processes of manufacturing the semiconductor device and in the usage environment of the semiconductor device.

Also, the third metal may include one of a Ti compound, W, and a W compound.

This structure allows for the formation of the metal layer that protects the ohmic electrode.

As described above, the present disclosure provides a semiconductor device and a method of manufacturing the same that are capable of reducing the amount of gate leakage current, while achieving normally-off characteristics and fast switching characteristics.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 15 is a cross-sectional view showing the structure of a semiconductor device according to Embodiment 2;

FIG. 16 is a cross-sectional view showing the structure of the semiconductor device according to Embodiment 2;

FIG. 17 is a cross-sectional view illustrating the method of manufacturing the semiconductor device according to Embodiment 2;

FIG. 18 is a cross-sectional view illustrating the method of manufacturing the semiconductor device according to Embodiment 2;

DETAILED DESCRIPTION OF THE EMBODIMENTS (Findings Forming Basis of Present Disclosure)

Figure 28:
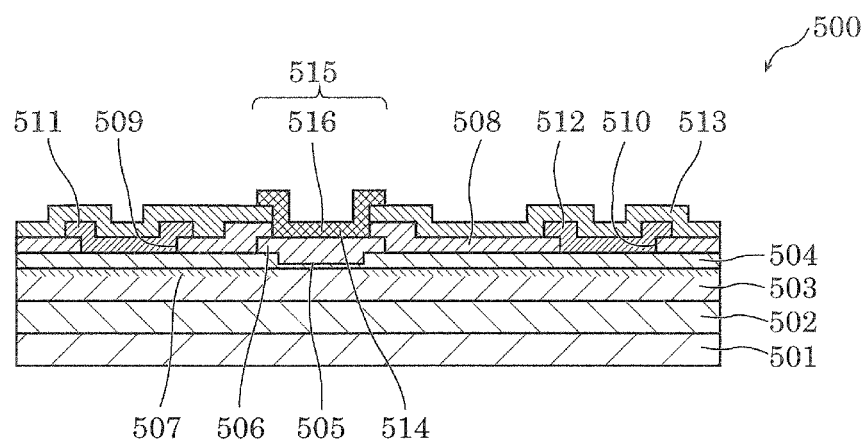
FIG. 28 is a cross-sectional view showing the structure of the conventional semiconductor device.
Figure 29:
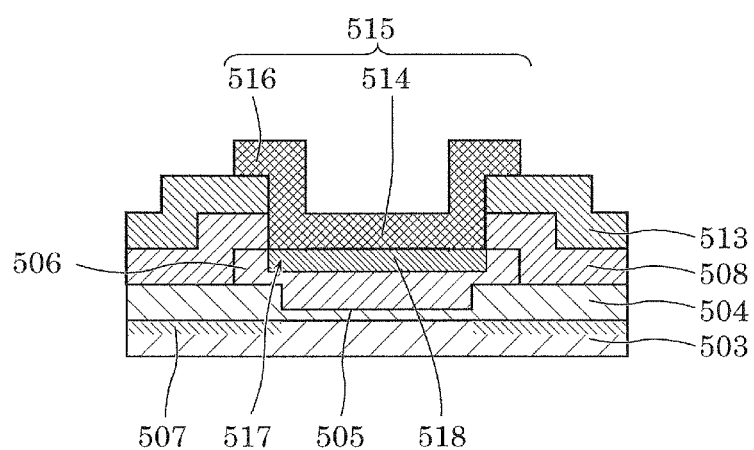
FIG. 29 is a cross-sectional view showing the structure of the conventional semiconductor device.

Before describing the embodiments according to the present disclosure, the findings that form the basis of the present disclosure will be described. FIG. 28 and FIG. 29 are cross-sectional views showing the structure of the conventional semiconductor device.

Semiconductor device 500 as shown in FIG. 28 is achieved by combining the technology disclosed in Japanese Unexamined Patent Application Publication No. 2009-200395 with, for example, the above-described technology that forms a gate electrode made of Ti on a surface of a p-type GaN layer, for the formation of a contact to a p-type GaN layer. Such semiconductor device 500 includes the following layers above substrate 501 that includes Si: buffer layer 502 having a multilayered structure including AlN and AlGaN; GaN layer 503; and AlGaN layer 504. Gate recess 505 that has been processed into a predetermined shape is formed in a surface of AlGaN layer 504. P-type GaN layer 506 that has been processed into a predetermined shape is formed on a surface of AlGaN layer 504 and on a surface of gate recess 505. In the semiconductor device having such structure, two-dimensional electron gas 507 occurs at the heterointerface between GaN layer 503 and AlGaN layer 504, except for the region below gate recess 505. Meanwhile, no two-dimensional electron gas 507 usually occurs in the region below gate recess 505. This means that semiconductor device 500 possesses normally-off characteristics.

Semiconductor device 500 further includes SiN film 508 on a surface of AlGaN layer 504 and on a surface of p-type GaN layer 506. Source opening 509 and drain opening 510 that reach AlGaN layer 504 are formed in SiN film 508. Source electrode 511 and drain electrode 512 are formed to cover these openings. Source electrode 511 and drain electrode 512 are in electrical contact with two-dimensional electron gas 507 that occurs at the heterointerface between GaN layer 503 and AlGaN layer 504.

Semiconductor device 500 includes SiN film 513 on each surface of SiN film 508, source electrode 511, and drain electrode 512. Gate opening 514 reaching p-type GaN layer 506 is formed above SiN film 508 and SiN film 513. Gate electrode 515 is formed to cover gate opening 514. Gate electrode 515 includes Ti film 516 that is formed to be in contact with p-type GaN layer 506. When an appropriate voltage is applied to gate electrode 515, two-dimensional electron gas 507 occurs in the region below gate recess 505. This means that semiconductor device 500 becomes turned on. Stated differently, semiconductor device 500 can be switched on or off by applying or not applying a voltage to the gate electrode.

However, the inventors have found, as a result of conducting various assessments on a prototype of semiconductor device 500 shown in FIG. 28, that semiconductor device 500 has a problem of an unexpected increase in the amount of gate leakage current in semiconductor device 500. An investigation on the cause of the increased amount of gate leakage current has revealed the findings described below.

FIG. 29 is an enlarged view of the vicinity of gate recess 505, p-type GaN layer 506, and gate electrode 515 in semiconductor device 500 shown in FIG. 28. As shown in FIG. 29, p-type GaN layer 506 located immediately above gate recess 505 includes defect 517 with a high frequency. Such defect 517 is thought to be unexpectedly included in the forming of p-type GaN layer 506 on a surface of gate recess 505.

Ti film 516 absorbs hydrogen contained in p-type GaN layer 506, as a result of which activation region 518 having a higher acceptor ion concentration than that of the surrounding regions is formed at the interface between p-type GaN layer 506 and Ti film 516. The width of a depletion layer in such activation region 518 is small, and thus the interface between p-type GaN layer 506 and Ti film 516 comes to exhibit ohmic characteristics. From the above findings, the inventors have concluded that any defect 517 in semiconductor device 500 causes a large current to flow via defect 517 and via the interface between p-type GaN layer 506 and Ti film 516, which in turn is observed as an increase in the amount of gate leakage current.

The following describes the embodiments according to the present disclosure as examples of the semiconductor device and the method of manufacturing the same that are capable of solving the above-described problem and reducing the amount of gate leakage current, while achieving normally-off characteristics and fast switching characteristics. Note that the following embodiments show an exemplary illustration of the present disclosure. The numerical values, shapes, materials, structural components, the arrangement and connection of the structural components, steps, the processing order of the steps etc. shown in the following embodiments are mere examples, and therefore are not intended to limit the present disclosure. Of the structural components described in the following embodiments, structural components not recited in any one of the independent claims that indicate the broadest concepts of the present disclosure will be described as optional structural components.

(Embodiment 1)

The following describes Embodiment 1 with reference to the drawings.

Figure 1:
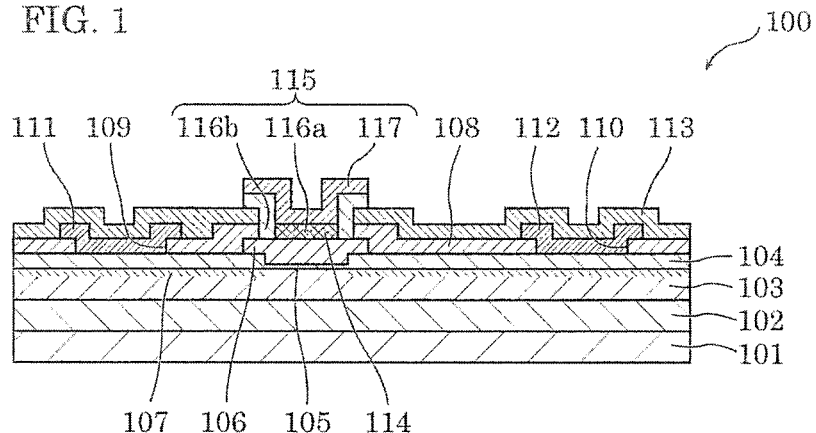
FIG. 1 is a cross-sectional view showing the structure of a semiconductor device according to Embodiment 1.

FIG. 1 is a cross-sectional view showing the structure of semiconductor device 100 according to the present embodiment. As shown in FIG. 1, semiconductor device 100 includes, for example, the following layers above substrate 101 that includes, for example, Si: buffer layer 102, with a thickness of 2 μm, having a multilayered structure including AlN and AlGaN; undoped (i-type) GaN layer 103 with a thickness of 2 μm; and i-type Al GaN layer 104 with a thickness of 80 nm and with an Al composition ratio of 15%. Note that "undoped (i-type)" means here that no impurity is intentionally doped in epitaxial growth. Also note that i-type AlGaN layer 104 corresponds to the semiconductor layer in the present disclosure.

Semiconductor device 100 includes, on a surface of i-type AlGaN layer 104, gate recess 105, with a depth of 60 nm, that has been processed into a predetermined shape. Semiconductor device 100 includes, on a surface of i-type AlGaN layer 104 and on a surface of gate recess 105, p-type GaN layer 106, with a thickness of 200 nm, that has been processed into a predetermined shape. P-type GaN layer 106 is doped with Mg on the order of $5 \times 10^{19}$ $cm^{-3}$. The majority of Mg, however, forms an Mg—H complex with H to be neutralized, and thus Mg on the order of $5 \times 10^{17}$ $cm^{-3}$, which equates to about 1% of Mg, act as acceptor ions. Note that p-type GaN layer 106 corresponds to the p-type semiconductor layer in the present disclosure, and thus that any composition that satisfies $Al_xIn_yGa_{1-x-y}N$ (0≤x<1, 0≤y<1) may be used. Stated differently, a composition obtained by replacing a part of Ga with Al and In is also acceptable.

In the semiconductor device having such structure, two-dimensional electron gas 107 occurs at the heterointerface between i-type GaN layer 103 and i-type AlGaN layer 104, except for the region below gate recess 105. Meanwhile, no two-dimensional electron gas 107 usually occurs in the region below gate recess 105. This means that semiconductor device 100 possesses normally-off characteristics.

Semiconductor device 100 includes SiN film 108 on a surface of i-type AlGaN layer 104 and on a surface of p-type GaN layer 106. SiN film 108 contains Si on the order of 50%, which is greater than the stoichiometric proportion (43%). Source opening 109 and drain opening 110 that reach i-type AlGaN layer 104 are formed in SiN film 108. Source electrode 111 and drain electrode 112 are formed to cover these openings.

Source electrode 111 and drain electrode 112 each include a Ti film and an Al film stacked in this order. Source electrode 111 and drain electrode 112 are in electrical contact with two-dimensional electron gas 107 that occurs at the heterointerface between i-type GaN layer 103 and i-type AlGaN layer 104.

Semiconductor device 100 includes SiN film 113 on each surface of SiN film 108, source electrode 111, and drain electrode 112. SiN film 113 also contains Si on the order of 50%, as in the case of SiN film 108. Gate opening 114 reaching p-type GaN layer 106 is formed in SiN film 108 and SiN film 113. Gate electrode 115 is formed to cover gate opening 114.

Gate electrode 115 includes: Ti film 116a that is formed to be in contact with p-type GaN layer 106 at a central portion of gate opening 114; nitrogen-containing Ti film 116b that is formed to be in contact with p-type GaN layer 106 at a periphery of gate opening 114; and TiN film 117 that is formed on a surface of Ti film 116a and on a surface of nitrogen-containing Ti film 116b. Ti film 116a and nitrogen-containing Ti film 116b absorb hydrogen contained in p-type GaN layer 106. Nitrogen-containing Ti film 116b has a lower hydrogen absorption capacity than that of Ti film 116a. P-type GaN layer 106, from which hydrogen has been absorbed, has an increased acceptor ion concentration to be activated. Note that Ti film 116a corresponds to the first metal (first hydrogen-absorbing alloy electrode) and nitrogen-containing Ti film 116b corresponds to the second metal (second hydrogen-absorbing alloy electrode) according to the present disclosure. Note that the second hydrogen-absorbing alloy electrode is not limited to the nitrogen-containing Ti film, and thus may be, for example, a TiN film. Also note that the first metal and the second metal form an ohmic electrode that is in contact with the top surface of p-type GaN layer 106.

Here, the widths of gate opening 114 and nitrogen-containing Ti film 116b are adjusted such that nitrogen-containing Ti film 116b positions immediately above the outer end of gate recess 105. Ti film 116a and nitrogen-containing Ti film 116b are both 20 nm thick, and TiN film 117 is 40 nm thick. When an appropriate voltage is applied to gate electrode 115, two-dimensional electron gas 107 occurs in the region below gate recess 105. This means that semiconductor device 100 becomes turned on.

Semiconductor device 100 having such structure is capable of reducing the amount of gate leakage current to a low level, while achieving normally-off characteristics and fast switching characteristics. The reason of this will be described below.

Figure 2:
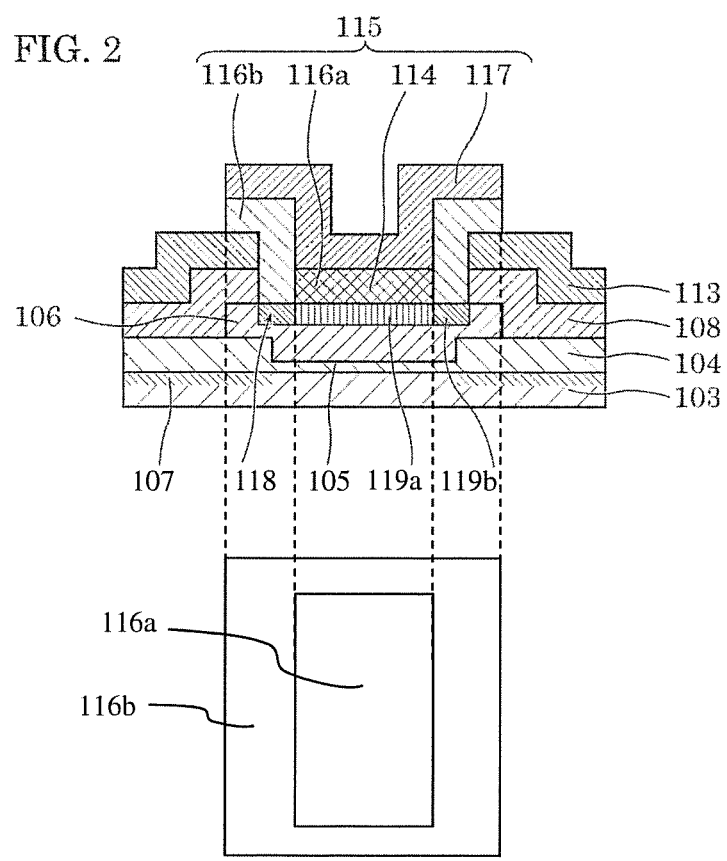
FIG. 2 is a cross-sectional view showing the structure of the semiconductor device according to Embodiment 1.

FIG. 2 is a cross-sectional view of semiconductor device 100 according to Embodiment 1 and is an enlarged view showing the vicinity of gate recess 105, p-type GaN layer 106, and gate electrode 115 in semiconductor device 100 shown in FIG. 1. As described above, p-type GaN layer 106 located immediately above gate recess 105 includes defect 118 with a high frequency. Here, defect 118 refers to a hollow or a region having a remarkably low atomic density formed inside p-type GaN layer 106. Many defects 118 have a shape in which an end face of gate recess 105 serves as a starting point and a surface of p-type GaN layer 106 serves as an endpoint, and grow in a vertical direction with respect to the main surface of semiconductor substrate 101. While the cause of defect 118 is unclear, it is probable that the vicinity of the end face of the gate recess has poor flatness at the atomic level compared with other regions.

Since Ti film 116a absorbs hydrogen contained in p-type GaN layer 106, first activation region 119a having a higher acceptor ion concentration than that of the surrounding regions is formed at the interface between p-type GaN layer 106 and Ti film 116a. The width of a depletion layer in such first activation region 119a is extremely small, and thus the interface between p-type GaN layer 106 and Ti film 116a exhibits substantial ohmic characteristics. Moreover, the contact resistivity between nitrogen-containing Ti film 116b and p-type GaN layer 106 is higher than the contact resistivity between Ti film 116a and p-type GaN layer 106.

Figure 3:
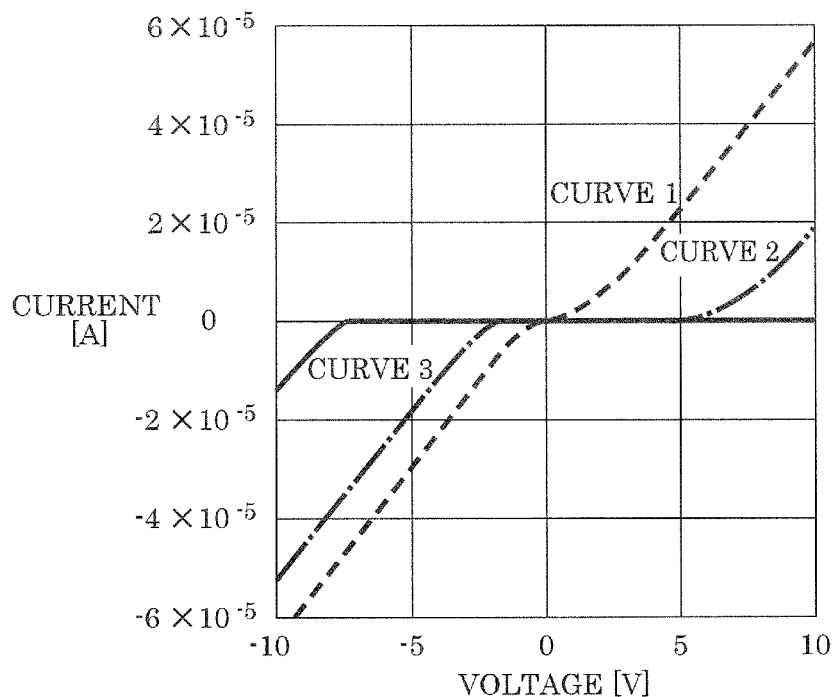
FIG. 3 is a graph showing I-V characteristics at the interface between a p-type GaN layer and a Ti film according to Embodiment 1.

FIG. 3 is a graph showing I-V characteristics at the interface between the p-type GaN layer and the Ti film according to the present embodiment. As curve 1 in FIG. 3 shows, exhibiting "substantial ohmic characteristics" means having bidirectionality, with the I-V characteristics showing non-linearity. The contact resistivity of a contact having such characteristics is typically low, and is advantageous to fast switching of semiconductor device 100.

Meanwhile, since the hydrogen absorption capacity of nitrogen-containing Ti film 116b is lower than that of Ti film 116a, second activation region 119b having a lower acceptor ion concentration than that of first activation region 119a is formed at the interface between p-type GaN layer 106 and nitrogen-containing Ti film 116b. The width of a depletion layer in such second activation region 119b is greater than that of first activation region 119a, and thus electric characteristics at the interface between p-type GaN layer 106 and nitrogen-containing Ti film 116b are more likely to change than the electric characteristics at the interface between p-type GaN layer 106 and Ti film 116a.

Here, changes in electric characteristics at the interface between p-type GaN layer 106 and nitrogen-containing Ti film 116b are roughly divided into two patterns. As curve 2 in FIG. 3 shows, when the concentration of nitrogen contained in nitrogen-containing Ti film 116b is low, the contact resistivity at the interface between p-type GaN layer 106 and nitrogen-containing Ti film 116b rises with substantial ohmic characteristics maintained. Here, Ti film 116a and nitrogen-containing Ti film 116b are in ohmic junction with p-type GaN layer 106. As curve 3 in FIG. 3 shows, when the concentration of nitrogen contained in nitrogen-containing Ti film 116b is high, the bilaterally of the I-V characteristics is lost, and nitrogen-containing Ti film 116b is brought into Schottky junction. Stated differently, Ti film 116a is in ohmic junction with p-type GaN layer 106, and nitrogen-containing Ti film 116b is in Schottky junction with p-type GaN layer 106.

As described above, in the present embodiment, the widths of gate opening 114 and nitrogen-containing Ti film 116b are adjusted such that nitrogen-containing Ti film 116b positions immediately above the outer end of gate recess 105. Thus, second activation region 119b is formed immediately above the outer end of gate recess 105. Furthermore, a junction with a higher resistance than that of a junction at the interface between p-type GaN layer 106 and Ti film 116a (substantial ohmic junction or Schottky junction with a high contact resistivity) is formed at the interface between p-type GaN layer 106 and nitrogen-containing Ti film 116b. Accordingly, even if semiconductor device 100 includes any defects 118, it is possible to keep low a voltage applied to defect 118 due to a voltage drop at the interface between p-type GaN layer 106 and nitrogen-containing Ti film 116b. As such, the present disclosure is capable of keeping low the amount of gate leakage current compared with the conventional technology.

With reference to FIG. 4 through FIG. 14, the following describes a method of manufacturing semiconductor device 100 according to the present embodiment. FIG. 4 through FIG. 14 are cross-sectional views illustrating the method of manufacturing semiconductor device 100 according to the present embodiment.

Figure 4:
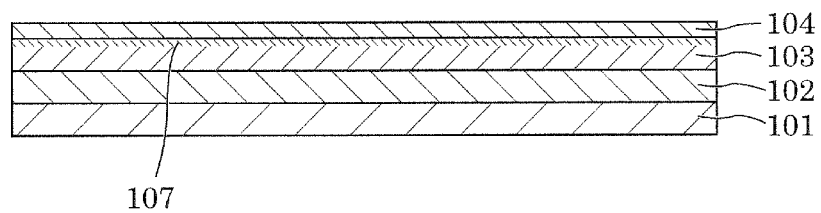
FIG. 4 is a cross-sectional view illustrating the method of manufacturing the semiconductor device according to Embodiment 1.

First, as shown in FIG. 4, the following layers are sequentially epitaxial grown above substrate 101 that includes Si, using metal organic chemical vapor deposition (MOCVD): buffer layer 102, with a thickness of 2 μm, having a multilayered structure including AlN and AlGaN; i-type GaN layer 103 with a thickness of 2 μm; and i-type Al GaN layer 104 with a thickness of 80 nm and with an Al composition ratio of 15%. As a result, two-dimensional electron gas 107 occurs at the heterointerface between i-type AlGaN layer 104 and i-type GaN layer 103.

Figure 5:
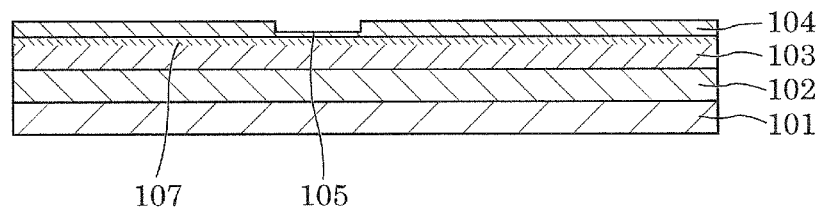
FIG. 5 is a cross-sectional view illustrating the method of manufacturing the semiconductor device according to Embodiment 1.

Next, as shown in FIG. 5, lithography and dry etching are sequentially applied to form gate recess 105 that is recessed from a surface of i-type Al GaN layer 104. Here, the depth of gate recess 105 is set to 60 nm. Gate recess 105 is formed to adjust the threshold voltage of semiconductor device 100. The depth of gate recess 105 may be adjusted or the formation of gate recess 105 may be omitted depending on a required threshold voltage.

Figure 6:
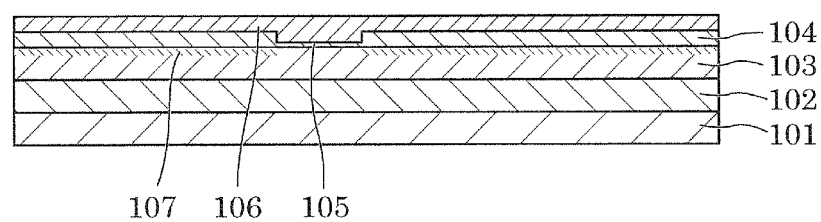
FIG. 6 is a cross-sectional view illustrating the method of manufacturing the semiconductor device according to Embodiment 1.

Next, as shown in FIG. 6, p-type GaN layer 106 with a thickness of 200 nm is epitaxial grown on a surface of i-type AlGaN layer 104 and on a surface of gate recess 105, using MOCVD. Here, the Mg concentration of p-type GaN layer 106 is set to $5\times10^{19}$ cm$^{-3}$. Under this condition, Mg and H form an Mg—H complex to be neutralized. Subsequently, the resultant is heat-treated, for example, at 1000° C. for 30 minutes in N$_2$ atmosphere. This activates Mg on the order of 1% and generates acceptor ions inside p-type GaN layer 106 with the concentration of about $5\times10^{17}$ cm$^{-3}$. Accordingly, the energy level in the vicinity of gate recess 105 rises, as a result of which two-dimensional electron gas 107 disappears.

Figure 7:
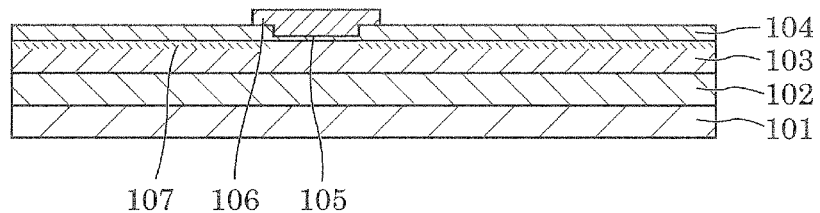
FIG. 7 is a cross-sectional view illustrating the method of manufacturing the semiconductor device according to Embodiment 1.

Next, as shown in FIG. 7, lithography and dry etching are sequentially applied to form p-type GaN layer 106 into a predetermined shape (e.g., a shape that covers gate recess 105 in a planar view). In the dry etching, the speed of etching i-type AlGaN layer 104 may be slower than the speed of etching p-type GaN layer 106, by adding oxygen gas to chlorine gas.

Figure 8:
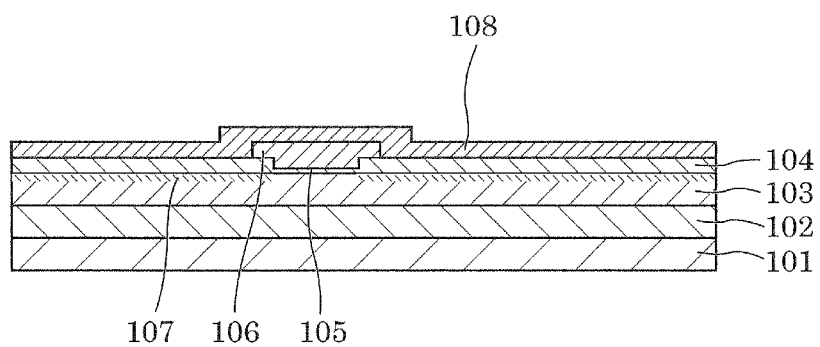
FIG. 8 is a cross-sectional view illustrating the method of manufacturing the semiconductor device according to Embodiment 1.

Next, as shown in FIG. 8, SiN film 108 with a thickness of 100 nm is deposited on a surface of i-type AlGaN layer 104 and on a surface of p-type GaN layer 106, using plasma CVD. SiH$_4$ and NH$_3$ are used as material gases. Adjustment of flow ratios of these two gasses enables the adjustment of the amount of Si contained in SiN film 108. The present embodiment sets the ratio of Si contained in SiN film 108 to 50%.

Figure 9:
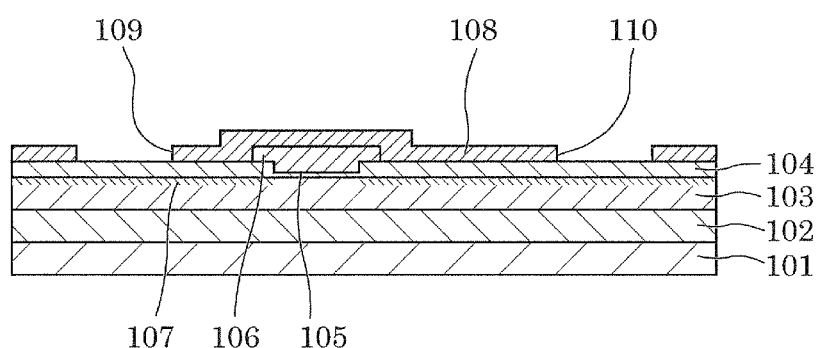
FIG. 9 is a cross-sectional view illustrating the method of manufacturing the semiconductor device according to Embodiment 1.

Next, as shown in FIG. 9, lithography and etching are sequentially applied to form, in predetermined regions inside SiN film 108, source opening 109 and drain opening 110 that reach i-type AlGaN layer 104. In the etching, a method may be employed by which the speed of etching SiN film 108 is faster and the speed of etching i-type AlGaN layer 104 is slower.

Figure 10:
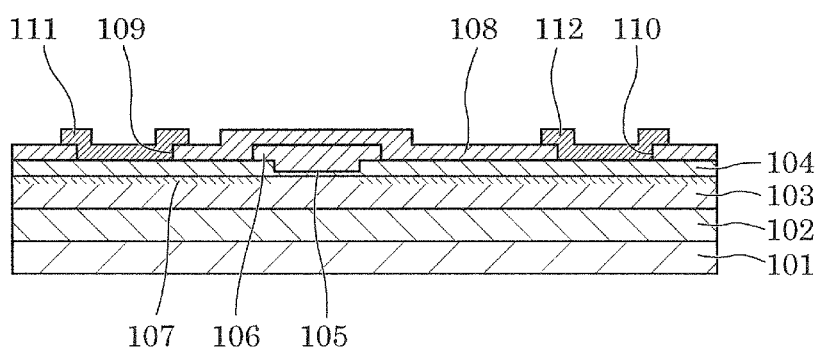
FIG. 10 is a cross-sectional view illustrating the method of manufacturing the semiconductor device according to Embodiment 1.

Next, as shown in FIG. 10, lithography and dry etching are sequentially applied, after the Ti film and the Al film are sequentially deposited, to form source electrode 111 and drain electrode 112 covering source opening 109 and drain opening 110. Source electrode 111 covers source opening 109, and drain electrode 112 covers drain opening 110.

Subsequently, the resultant is heat-treated at 600° C. in N$_2$ atmosphere to bring source electrode 111 and drain electrode 112 into ohmic junction with two-dimensional electron gas 107 that occurs at the heterointerface between i-type AlGaN layer 104 and i-type GaN layer 103.

Figure 11:
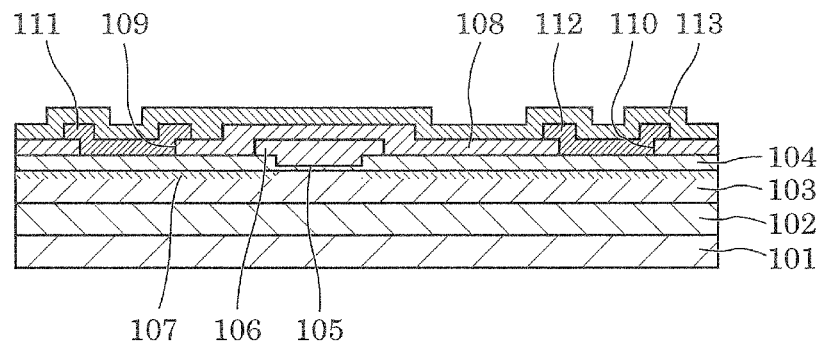
FIG. 11 is a cross-sectional view illustrating the method of manufacturing the semiconductor device according to Embodiment 1.

Next, as shown in FIG. 11, SiN film 113 with a thickness of 100 nm is deposited on each surface of SiN film 108, source electrode 111, and drain electrode 112, using plasma CVD. The present embodiment sets the ratio of Si contained in SiN film 113 to 50%, as in the case of SiN film 108.

Figure 12:
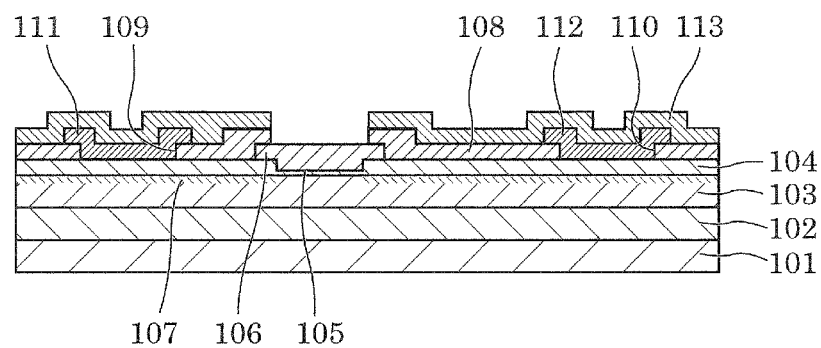
FIG. 12 is a cross-sectional view illustrating the method of manufacturing the semiconductor device according to Embodiment 1.

Next, as shown in FIG. 12, lithography and etching are sequentially applied to form, above a region that includes gate recess 105 and that is wider than gate recess 105, gate opening 114 that penetrates SiN film 108 and SiN film 113 to reach p-type GaN layer 106 (see FIG. 1).

Here, the etching is carried out through the following two steps: first, a portion that is about 140 nm deep from a surface of SiN film 113 is etched by dry etching using CF$_4$ gas; and then, the remaining portion of about 60 nm is etched by wet etching in HF solution.

Figure 13:
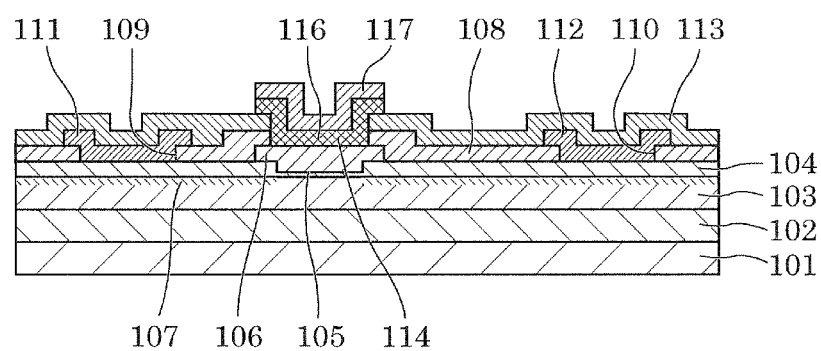
FIG. 13 is a cross-sectional view illustrating the method of manufacturing the semiconductor device according to Embodiment 1.

Next, as shown in FIG. 13, Ti film 116 with a thickness of 20 nm and TiN film 117 with a thickness of 40 nm are sequentially deposited, by sputtering, above a surface of p-type GaN layer 106 and above a surface of SiN film 113 exposed at gate opening 114. Stated differently, TiN film 117 is formed on a surface of Ti film 116. Here, Ti film 116 (to be nitrogen-containing Ti film 116b in a subsequent process) deposited at end faces of SiN film 108 and SiN film 113, which define wall surfaces of gate opening 114, is located immediately above the outer end of gate recess 105. Subsequently, lithography and dry etching are sequentially applied to remove those portions of Ti film 116 and TiN film 117 that are formed in the regions other than the portion above p-type GaN layer 106. This forms gate electrode 115 that covers gate opening 114. Note that TiN film 117 corresponds to the metal layer according to the present disclosure.

Figure 14:
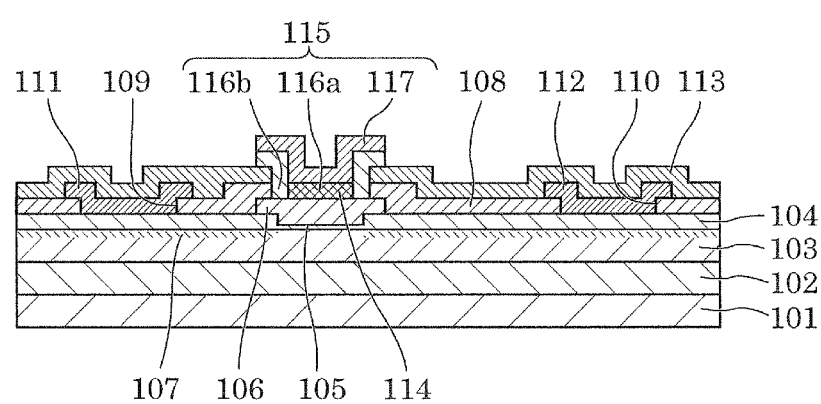
FIG. 14 is a cross-sectional view illustrating the method of manufacturing the semiconductor device according to Embodiment 1.

Finally, to selectively alter the quality of the outer periphery of Ti film 116, the resultant is heat-treated at 700° C. for 5 minutes in NH$_3$ atmosphere to add nitrogen from side walls of Ti film 116. This enables Ti film 116 to have two portions: Ti film 116a that contains no nitrogen; and nitrogen-containing Ti film 116b that contains nitrogen. Nitrogen-containing Ti film 116b that contains nitrogen is formed as the outer periphery of Ti film 116a that contains no nitrogen. Accordingly, gate electrode 115 is formed of Ti film 116a, nitrogen-containing Ti film 116b, and TiN film 117. Moreover, nitrogen-containing Ti film 116b is formed to surround the outer periphery of Ti film 116a. Semiconductor device 100 shown in FIG. 14 is completed through the above-described process.

As is clear from the fact that Ti film 116a and nitrogen-containing Ti film 116b are formed by heat treatment in $N_2$ atmosphere, these portions do not necessarily have a distinct boundary. It is difficult in many cases to find a distinct boundary, for the concentration of hydrogen or nitrogen continuously decreases from the end face of nitrogen-containing Ti film 116b to inside Ti film 116a. However, since the nitrogen concentration of nitrogen-containing Ti film 116b is preferably 20% or greater in the present disclosure, a point at which the nitrogen concentration reaches 20% is regarded as the boundary between Ti film 116a and nitrogen-containing Ti film 116b. Also note that it is possible to readily see that heat treatment in $N_2$ atmosphere has yielded two portions of Ti film 116a and nitrogen-containing Ti film 116b, by, for example, cleaving semiconductor device 100 to immerse the resultant in a solution such as HF, and then observing the cleaved surface by, for example, a scanning electron microscope (SEM).

After this, a passivation film, a multi-layer wiring, and a bonding pad may be formed in semiconductor device 100, where necessary.

As described above, semiconductor device 100 and the method of manufacturing semiconductor device 100 according to the present disclosure enable a high-resistance junction (substantial ohmic junction or Schottky junction with a high contact resistivity) to be formed immediately above the outer end of gate recess 105. Accordingly, even if semiconductor device 100 includes any defects 118, it is possible to keep low a voltage applied to defect 118 due to a voltage drop at the interface between p-type GaN layer 106 and Ti film 116a. The present disclosure is thus capable of keeping low the amount of gate leakage current.

(Embodiment 2)

The following describes Embodiment 2 with reference to the drawings. FIG. 15 is a cross-sectional view showing the structure of semiconductor device 200 according to the present embodiment. In FIG. 15, the same structural components as those shown in FIG. 1 are assigned with the same reference marks, and will not be described below.

Semiconductor device 200 according to Embodiment 2 is different from semiconductor device 100 according to Embodiment 1 in the structure of the gate electrode. More specifically, gate electrode 115 according to Embodiment 1 is partially in contact, via gate opening 114, with the surface of p-type GaN layer 106 that is opposite to the surface on which gate recess 105 is formed. Meanwhile, gate electrode 120 according to Embodiment 2 is entirely in contact with the surface of p-type GaN layer 106 that is opposite to the surface on which gate recess 105 is formed. Moreover, p-type GaN layer 106 and gate electrode 120 are processed into the same shape.

Gate electrode 120 includes: Ti film 121a that is formed to be in contact with a central portion of p-type GaN layer 106; nitrogen-containing Ti film 121b that is formed to be in contact with a periphery of p-type GaN layer 106 and to surround Ti film 121a; and TiN film 122 that is formed on a surface of Ti film 121a and on a surface of nitrogen-containing Ti film 121b. Here, the width of nitrogen-containing Ti film 121b is adjusted such that nitrogen-containing Ti film 121b positions immediately above the outer end of gate recess 105. Ti film 121a and nitrogen-containing Ti film 121b are both 20 nm thick, and TiN film 122 is 40 nm thick.

Semiconductor device 200 includes SiN film 108 on each surface of i-type AlGaN layer 104, p-type GaN layer 106, and gate electrode 120. Source opening 109 and drain opening 110 that reach i-type AlGaN layer 104 are formed in SiN film 108. Source electrode 111 and drain electrode 112 are formed to cover these openings.

Semiconductor device 200 having such structure is capable of keeping low the amount of gate leakage current, while achieving normally-off characteristics and fast switching. The reason will be described below.

FIG. 16 is an enlarged view showing the vicinity of gate recess 105, p-type GaN layer 106, and gate electrode 120 in semiconductor device 200 shown in FIG. 15. As described above, p-type GaN layer 106 located immediately above gate recess 105 includes defect 118 with a high frequency.

Since Ti film 121a absorbs hydrogen contained in p-type GaN layer 106, first activation region 123a having a higher acceptor ion concentration than that of the surrounding regions is formed at the interface between p-type GaN layer 106 and Ti film 121a. The width of a depletion layer in such first activation region 123a is small, and thus the interface between p-type GaN layer 106 and Ti film 121a exhibits substantial ohmic characteristics.

Meanwhile, since the hydrogen absorption capacity of nitrogen-containing Ti film 121b is lower than that of Ti film 121a, second activation region 123b having a lower acceptor ion concentration than that of first activation region 123a is formed at the interface between p-type GaN layer 106 and nitrogen-containing Ti film 121b. The width of a depletion layer in such second activation region 123b is greater than that of first activation region 123a, and thus a junction with a higher resistance than that of a junction formed at the interface between p-type GaN layer 106 and Ti film 121a is formed at the interface between p-type GaN layer 106 and nitrogen-containing Ti film 121b.

As described above, in the present embodiment, the width of nitrogen-containing Ti film 121b is adjusted such that nitrogen-containing Ti film 121b positions immediately above the outer end of gate recess 105. Accordingly, even if semiconductor device 200 includes any defects 118, it is possible to keep low a voltage applied to defect 118 due to a voltage drop at the interface between p-type GaN layer 106 and nitrogen-containing Ti film 121b. As such, the present disclosure is capable of keeping low the amount of gate leakage current compared with the conventional technology.

With reference to FIG. 17 through FIG. 23, the following describes a method of manufacturing semiconductor device 200 according to the present embodiment.

First, as in the case of Embodiment 1, the processes shown in FIG. 4 through FIG. 6 are performed to obtain the structure shown in FIG. 17.

Next, as shown in FIG. 18, Ti film 121 with a thickness of 20 nm, TiN film 122 with a thickness of 40 nm, and $SiO_2$ film 123 with a thickness of 60 nm are sequentially deposited above a surface of p-type GaN layer 106.

Figure 19:
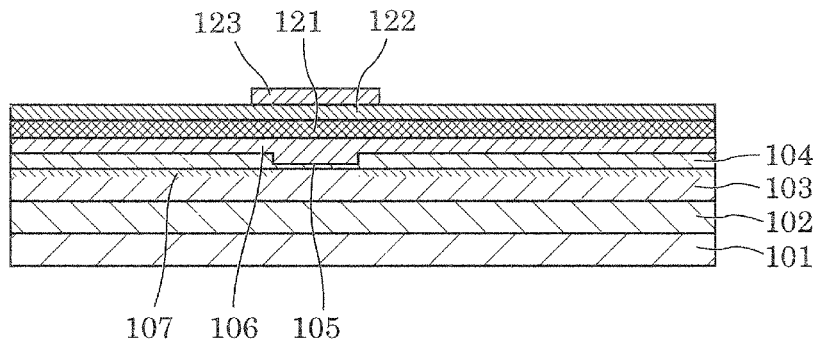
FIG. 19 is a cross-sectional view illustrating the method of manufacturing the semiconductor device according to Embodiment 2.

Next, as shown in FIG. 19, lithography and dry etching are sequentially applied to form $SiO_2$ film 123 into a predetermined shape (e.g., a shape that covers gate recess 105 in a planar view).

Figure 20:
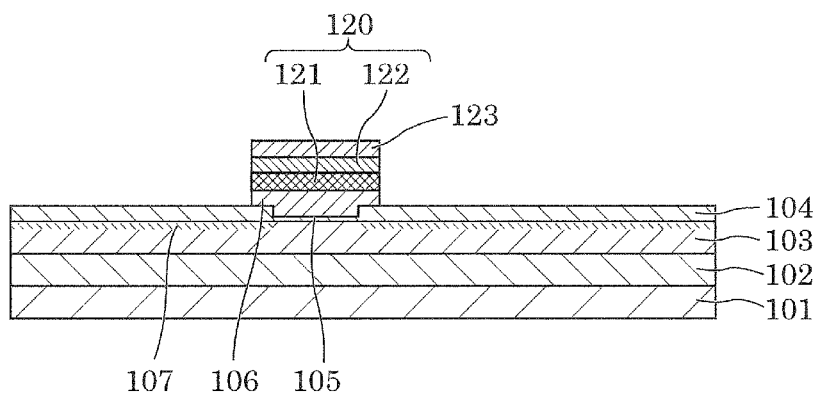
FIG. 20 is a cross-sectional view illustrating the method of manufacturing the semiconductor device according to Embodiment 2.

Next, as shown in FIG. 20, using $SiO_2$ film 123 as a mask, dry etching is applied to form p-type GaN layer 106, Ti film 121, and TiN film 122 into a predetermined shape. This yields Ti film 121 and TiN film 122 that are processed into the same shape as the shape of p-type GaN layer 106 in a planar view. Ti film 121 and TiN film 122 form gate electrode 120.

Figure 21:
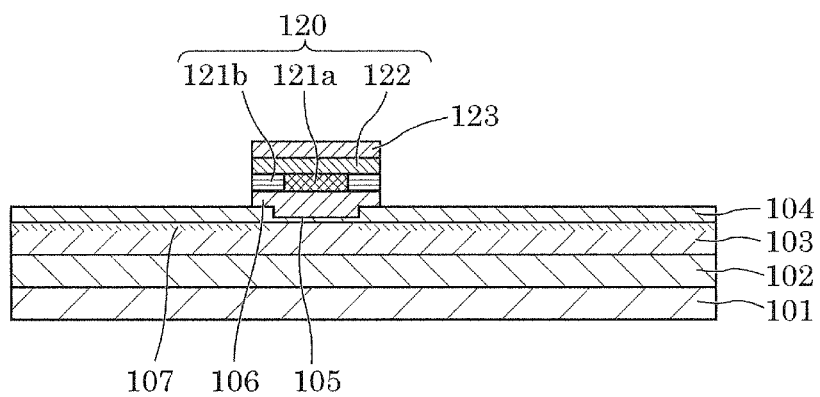
FIG. 21 is a cross-sectional view illustrating the method of manufacturing the semiconductor device according to Embodiment 2.

Next, as shown in FIG. 21, the resultant is heat-treated at 600° C. for 3 minutes in $N_2$ atmosphere to add nitrogen from side walls of Ti film 121. This enables Ti film 121 to include two portions: Ti film 121a that contains no nitrogen; and nitrogen-containing Ti film 121b that contains nitrogen.

Here, as in the case of Embodiment 1, Ti film 121*a* and nitrogen-containing Ti film 121*b* do not necessarily have a distinct boundary.

Note that the method of manufacturing semiconductor device 200 according to Embodiment 2 typically involves a lower thermal budget of the heat treatment for adding nitrogen from side walls of the Ti film than the method of manufacturing semiconductor device 100 according to Embodiment 1. This is because the method of manufacturing semiconductor device 200 according to Embodiment 2 typically requires the nitrogen-containing Ti film to have a smaller width than is required by Embodiment 1.

Figure 22:
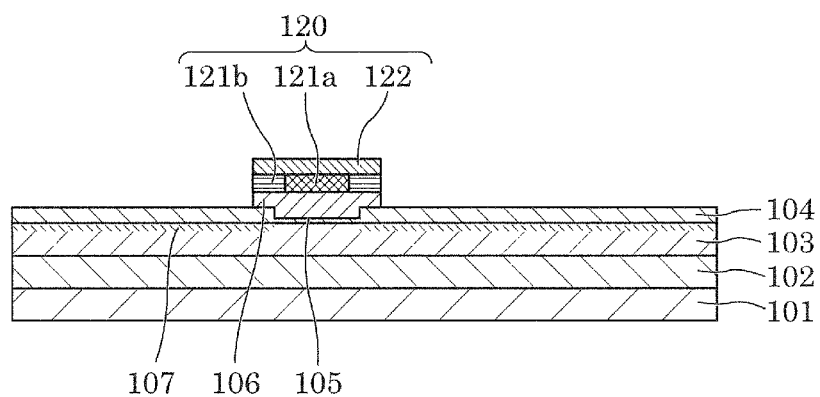
FIG. 22 is a cross-sectional view illustrating the method of manufacturing the semiconductor device according to Embodiment 2.

Next, as shown in FIG. 22, wet etching using HF is applied to remove $SiO_2$ film 123. Here, since the rate of etching nitrogen-containing Ti film 121*b* in HF is widely decreased due to the added nitrogen, a residue remains after the wet etching. Without the process of adding nitrogen shown in FIG. 21, Ti film 121 would expose at the side walls in the process shown in FIG. 22, and would be entirely dissolved by the wet etching using HF. This in turn would lead to the failure to manufacture semiconductor device 200 as intended.

Figure 23:
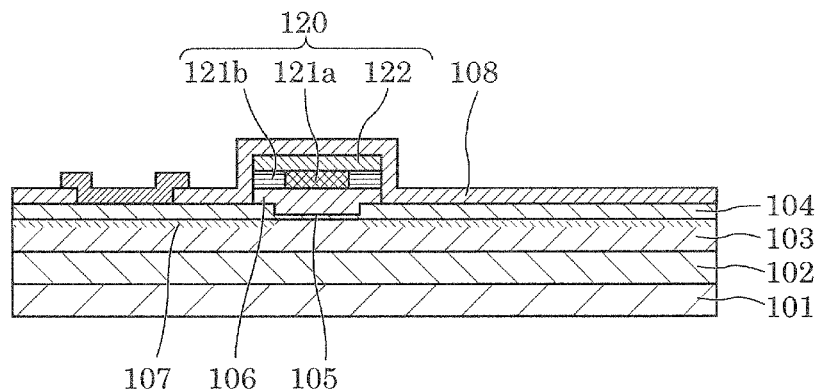
FIG. 23 is a cross-sectional view illustrating the method of manufacturing the semiconductor device according to Embodiment 2.

Next, as shown in FIG. 23, SiN film 108 with a thickness of 100 nm is deposited on each surface of i-type AlGaN layer 104, p-type GaN layer 106, and gate electrode 120, using plasma CVD.

Figure 24:
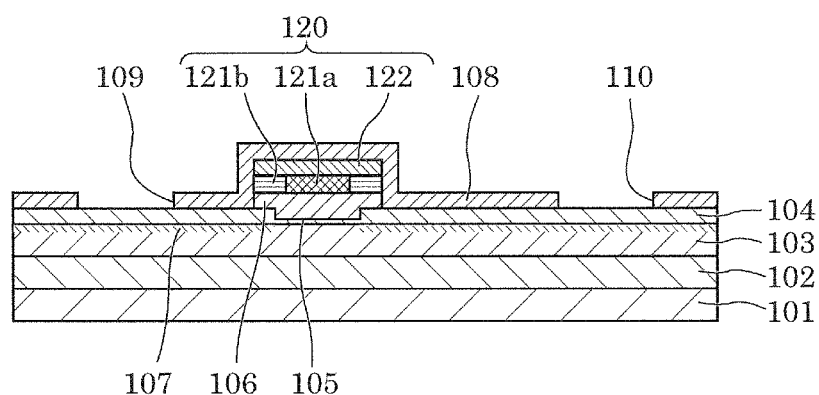
FIG. 24 is a cross-sectional view illustrating the method of manufacturing the semiconductor device according to Embodiment 2.

Next, as shown in FIG. 24, lithography and etching are sequentially applied to form, in predetermined regions inside SiN film 108, source opening 109 and drain opening 110 that reach i-type AlGaN layer 104.

Figure 25:
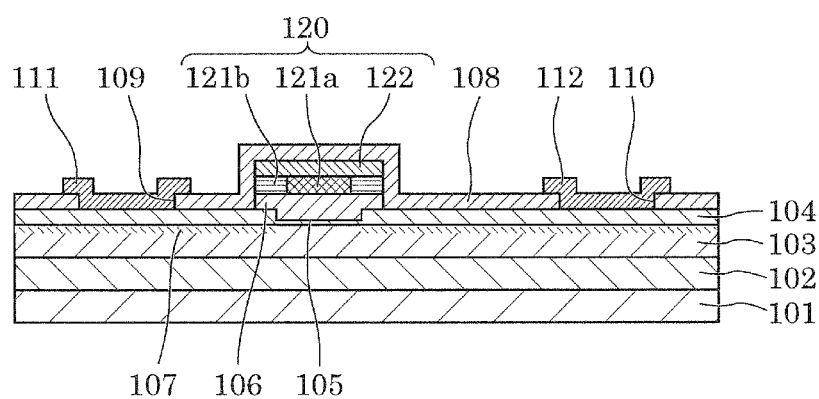
FIG. 25 is a cross-sectional view illustrating the method of manufacturing the semiconductor device according to Embodiment 2.

Next, lithography and dry etching are sequentially applied, after the Ti film and the Al film are sequentially deposited, to form source electrode 111 and drain electrode 112 covering source opening 109 and drain opening 110. Subsequently, the resultant is heat-treated at 600° C. in $N_2$ atmosphere to bring source electrode 111 and drain electrode 112 into ohmic junction with two-dimensional electron gas 107 that occurs at the heterointerface between i-type AlGaN layer 104 and i-type GaN layer 103. Semiconductor device 200 shown in FIG. 25 is completed through the above-described process.

After this, a passivation film, a multi-layer wiring, and a bonding pad may be formed in semiconductor device 200, where necessary.

(Embodiment 3)

Figure 26:
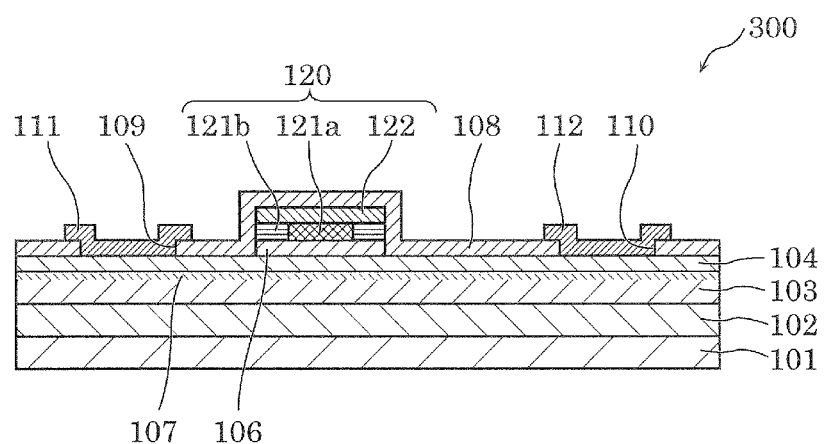
FIG. 26 is a cross-sectional view showing the structure of a semiconductor device according to Embodiment 3.
Figure 27:
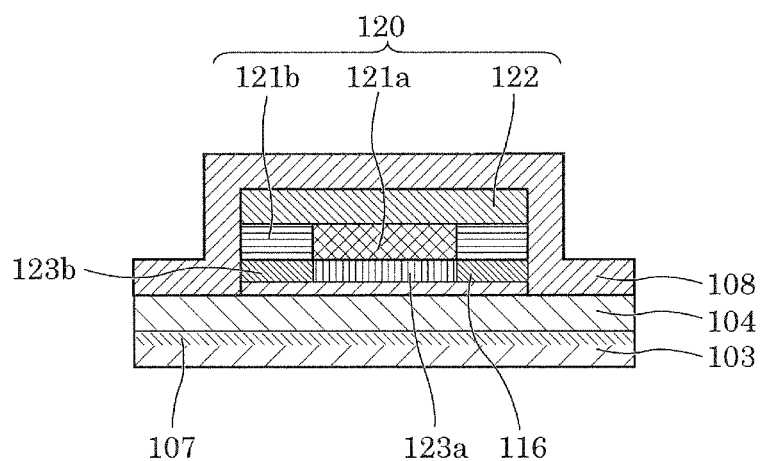
FIG. 27 is a cross-sectional view showing the structure of the semiconductor device according to Embodiment 3.

The following describes Embodiment 3 with reference to the drawings. FIG. 26 and FIG. 27 are cross-sectional views showing the structure of semiconductor device 300 according to Embodiment 3. In FIG. 26 and FIG. 27, the same structural components as those shown in FIG. 1 are assigned with the same reference marks, and will not be described below.

Semiconductor device 300 according to Embodiment 3 is different from semiconductor device 100 according to Embodiment 1 in that semiconductor device 300 includes no gate recess 105 in a surface of i-type AlGaN layer 104.

In the case of semiconductor device 200 according to Embodiment 2, Ti film 121 is formed on a surface of p-type GaN layer 106, after which Ti film 121 and p-type GaN layer 106 are processed into the same shape. This results in an end face of p-type GaN layer 106 and an end face of Ti film 121 coming in contact with each other. Even in the case where the formation of gate recess 105 is omitted and thus no defect 118 will be generated, the process shown in FIG. 21 of heat treatment at 600° C. for three minutes in $N_2$ atmosphere may be performed to add nitrogen from side walls of Ti film 121 to form nitrogen-containing Ti film 121*b*.

Semiconductor device 300 shown in FIG. 26 and FIG. 27 is an example semiconductor device having such structure. Semiconductor device 300 shown in FIG. 26 and FIG. 27 includes no gate recess, and thus two-dimensional electron gas 107 occurs at the heterointerface between i-type GaN layer 103 and i-type AlGaN layer 104. Stated differently, two-dimensional electron gas 107 occurs also in the region where gate electrode 120 is formed.

This structure keeps low the amount of gate leakage current, for an end face of p-type GaN layer 106 also serves as a path over which gate leakage current flows, as in the case of defect 118. In other words, the formation of nitrogen-containing Ti film 121*b* that is in contact with an end face of p-type GaN layer 106 enables a reduced amount of gate leakage current to flow via an end face of p-type GaN layer 106.

(Other Embodiments)

The embodiments have been described above as examples of one or more aspects of the present disclosure, but the present disclosure is not limited to such embodiments.

For example, GaN doped with Mg is used as the material of p-type GaN layer 106 in the foregoing embodiments, $Al_xIn_yG_{1-x-y}N$ ($0 \leq x < 1$, $0 \leq y < 1$) containing p-type impurities may alternatively be used.

Also, the Ti film is formed on a surface of the p-type GaN layer in the foregoing embodiments. The Ti film functions to absorb hydrogen contained in the p-type GaN layer to form an activation region with a higher acceptor ion concentration than that of the surrounding regions. Stated differently, a film having such function may alternatively be used. Examples of such film include a hydrogen absorbing alloy such as a Pd film and an Ni film Also, the foregoing embodiments include the process of forming the nitrogen-containing Ti film by adding nitrogen to the Ti film from its side walls Such process is intended for intentionally forming a portion having a low hydrogen absorption capacity. Stated differently, another process that decreases the hydrogen absorption capacity of the hydrogen absorbing alloy may alternatively be used. Examples of such process include heat treatment performed in $H_2$ atmosphere. In this case, the use of a Ti film as a hydrogen absorbing alloy results in the formation of a hydrogen-containing Ti film, the use of a Pd film results in a hydrogen-containing Pd film, and the use of an Ni film results in a hydrogen-containing Ni film.

In the foregoing embodiments, Ti is used as the material of the first hydrogen absorbing alloy electrode, and a nitrogen-containing Ti is used as the material of the second hydrogen absorbing alloy electrode, but the first hydrogen absorbing alloy electrode may include Ti, and the second hydrogen absorbing alloy electrode may include, for example, one of nitrogen-containing Ti and TiN. Alternatively, the first hydrogen absorbing alloy electrode may include, for example, one of Ti, Pd, and Ni, and the second hydrogen absorbing alloy electrode may include, for example, one of hydrogen-containing Ti, hydrogen-containing Pd, and hydrogen-containing Ni.

As in the case of the foregoing embodiments, in which nitrogen is added from side walls of the Ti film that has been deposited to form a nitrogen-containing Ti film, the resulting semiconductor device has a strong tolerance to harsh conditions (e.g., high temperature and high humidity) for a long period of time. This feature is attributable to the fact that the quality of the Ti film located inside such nitrogen-containing TiN film is subjected to little change thanks to the properties of the nitrogen-containing TiN film of being chemically inactive and having a dense structure that inhibits the passage of other substances. To this end, it is recommended that the nitrogen concentration of the nitrogen-containing TiN film be increased to form titanium nitride. For example, the nitrogen concentration of 33% yields $TiN_2$, and the nitrogen concentration of 50% yields TiN.

Also, it is described in the foregoing embodiments that the Ti film may be surrounded by a film that is chemically more inactive than Ti (e.g., a nitrogen-containing Ti film and a TiN film). Here, the standard Gibbs energy of formation serves as an index of chemical activity. Each substance has its specific value of Gibbs energy, which is determined as follows:

(1) Consider the reaction for the synthesis of the respective single constituent elements of target substance 1 mol;

(2) Assume that the starting point and the final point of the reaction are both in the standard condition; and (3) Determine the standard Gibbs energy by the following equation:

(Standard Gibbs energy of formation)=(Gibbs energy of formed substance)−(Gibbs energy of the single constituent elements)

In general, the smaller the value of the standard Gibbs energy determined by the above equation, the more stable the substance is. For example, the standard Gibbs energy of formation of Ti is 0 kJ/mol, and the standard Gibbs energy of formation of TiN is 309 kJ/mol, which means that the standard Gibbs energy of formation of TiN is smaller than the standard Gibbs energy of formation of Ti. TiN is thus more stable than Ti, or more specifically, TiN is chemically less active than Ti.

In the foregoing embodiments, the TiN film, being a metal layer, is formed on a surface of the Ti film and on a surface of the nitrogen-containing Ti film. The TiN film functions to protect the Ti film from possible damages in the processes of manufacturing the semiconductor device and the usage environment of the semiconductor device. Stated differently, a film having such function may alternatively be used. Examples of such film include a Ti compound film such as a TiSiN film, and a W compound film such as a W film and a WSiN film.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful as a power-switching element used, for example, in an inverter and a power circuit. The method of manufacturing a semiconductor device according to the present disclosure is capable of manufacturing the semiconductor device described above.

What is claimed is:

1. A semiconductor device comprising:
a substrate;
a p-type semiconductor layer that is formed above the substrate, and includes $Al_xIn_yGa_{1-x-y}N$ containing p-type impurities, where $0 \leq x < 1$, $0 \leq y < 1$; and
an ohmic electrode that is in contact with a top surface of the p-type semiconductor layer,
wherein the ohmic electrode includes a first metal that is highly chemically active, and a second metal that is less chemically active than the first metal,
the second metal contains an element of the first metal, disposed on side surfaces of the first metal in a sectional view, and continuously surrounds an outer periphery of the first metal in a planar view, and
the first metal and the second metal are in direct contact with the top surface of the p-type semiconductor layer.

2. The semiconductor device according to claim 1, wherein a standard Gibbs energy of formation of the first metal is greater than a standard Gibbs energy of formation of the second metal.

3. The semiconductor device according to claim 1, wherein a hydrogen absorption capacity of the first metal is higher than a hydrogen absorption capacity of the second metal.

4. The semiconductor device according to claim 1, wherein the p-type semiconductor layer includes:
a first activation region that is in contact with the first metal; and
a second activation region that is in contact with the second metal, and
an acceptor ion concentration of the first activation region is higher than an acceptor ion concentration of the second activation region.

5. The semiconductor device according to claim 4, wherein a first semiconductor layer having a surface with a stepped portion is formed above the substrate,
the p-type semiconductor layer is formed on the stepped portion, and
the second activation region is formed immediately above an outer end of the stepped portion.

6. The semiconductor device according to claim 1, wherein a contact resistivity between the first metal and the p-type semiconductor layer is lower than a contact resistivity between the second metal and the p-type semiconductor layer.

7. The semiconductor device according to claim 1, wherein the second metal is in Schottky junction with the p-type semiconductor layer.

8. The semiconductor device according to claim 1, wherein the p-type semiconductor layer and the ohmic electrode are processed into an identical shape in a planar view.

9. The semiconductor device according to claim 1, wherein the first metal includes Ti, and
the second metal includes TiN.

10. The semiconductor device according to claim 9, wherein a concentration of hydrogen or nitrogen contained in the second metal continuously decreases from an end face toward an inside of the second metal.

11. The semiconductor device according to claim 1, wherein the first metal includes one of Ti, Pd, and Ni, and
the second metal includes one of hydrogen-containing Ti, hydrogen-containing Pd, and hydrogen-containing Ni.

12. The semiconductor device according to claim 1, wherein a third metal is formed on a top surface of the first metal, and
the second metal covers an entirety of a side surface of the first metal and the third metal covers an entirety of the top surface of the first metal without any exposed portions.

13. The semiconductor device according to claim 12, wherein the third metal includes one of a Ti compound, W, and a W compound.

14. The semiconductor device according to claim 1, wherein the second metal is disposed on outermost portions of the side surfaces of the first metal in a sectional view.

* * * * *